US009728595B2

(12) United States Patent
Park et al.

(10) Patent No.: US 9,728,595 B2
(45) Date of Patent: Aug. 8, 2017

(54) DISPLAY DEVICE WITH POWER SUPPLY IN COVER TYPE

(71) Applicant: LG Display Co., Ltd., Seoul (KR)

(72) Inventors: SungWoo Park, Gimhae-si (KR); Ilgi Jeong, Chungcheongbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/877,824

(22) Filed: Oct. 7, 2015

(65) Prior Publication Data

US 2016/0118454 A1 Apr. 28, 2016

(30) Foreign Application Priority Data

Oct. 28, 2014 (KR) .......................... 10-2014-0147347

(51) Int. Cl.
*H01L 27/32* (2006.01)
*H01L 51/52* (2006.01)

(52) U.S. Cl.
CPC ........ *H01L 27/3276* (2013.01); *H01L 27/326* (2013.01); *H01L 27/3248* (2013.01); *H01L 27/3253* (2013.01); *H01L 51/5243* (2013.01); *H01L 27/3288* (2013.01); *H01L 51/5203* (2013.01)

(58) Field of Classification Search
CPC ............. H01L 27/3276; H01L 51/5243; H01L 27/3253; H01L 27/326; H01L 27/3248; H01L 51/5203; H01L 27/3288
See application file for complete search history.

(56) References Cited

U.S. PATENT DOCUMENTS

2012/0025229 A1* 2/2012 Lee .................... H01L 27/3276
257/91
2012/0146491 A1* 6/2012 Ra ....................... H01L 27/3276
313/512

OTHER PUBLICATIONS

Extended European Search Report, European Application No. 15190112.1, Apr. 1, 2016, 8 pages.

* cited by examiner

*Primary Examiner* — Kyoung Lee
(74) *Attorney, Agent, or Firm* — Fenwick & West LLP

(57) ABSTRACT

A display device comprises a display panel having a display area, in which a plurality of pixels and at least one power line for supplying power to the pixels are formed, and a non-display area outside the display area; and a cover disposed over the display panel so as to cover the display area of the display panel. The cover comprises at least one electrically conductive portion coupled to the at least one power line and configured to receive at least one power supply voltage via the non-display area and supply the at least one power supply voltage to the at least one power line in the display area.

15 Claims, 15 Drawing Sheets

DISPLAY DEVICE WITH POWER SUPPLY IN COVER TYPE

CROSS-REFERENCE TO RELATED APPLICATION

This application claims priority from and the benefit under 35 U.S.C §119(a) of Korean Patent Application No. 10-2014-0147347, filed on Oct. 28, 2014, which is hereby incorporated by reference for all purposes as fully set forth herein.

BACKGROUND

1. Technical Field

The present disclosure relates to a display device with a power supply in a cover type.

2. Description of the Prior Art

With the development of information technology, demands for various display devices, which display images, have increased. Recently, various display devices, such as liquid crystal displays (LCDs), plasma display panels (PDPs), or organic light emitting display devices (OLEDs), have been widely used. The display devices adopt corresponding display panels.

The display panel included in the display device may be one of a plurality of display panels that are manufactured through a single panel. That is, elements of pixels, signal lines, or power lines may be formed on a single substrate according to manufacturing processes, and then the substrate may be cut into unit panels using scribe equipment.

In addition, the panel is comprised of a display area where organic light emitting diodes or a liquid crystal display are formed, and a non-display area where a plurality of pads are formed. A voltage is applied to a plurality of pixels in the display area through the non-display area. In the case of large scale display devices, a secondary electrical power may be applied in a source board of the non-display area for a stable power supply. In this structure, the applied voltage may cause heat emission, which may affect the quality of the display device. In addition, additional power cables or lines are required to apply the secondary electrical power. Therefore, technology for supplying a stable electrical power is required in the large scale display devices.

SUMMARY

Accordingly, the present embodiments are directed to provide a display device that substantially obviates one or more problems due to limitations and disadvantages of the related art.

An aspect of the present embodiments is directed to provide a configuration that enables stable electrical power supply in a display device, for example in a large scale display device.

Various embodiments provide a display device, comprising: a display panel having a display area, in which a plurality of pixels and at least one power line for supplying power to the pixels are formed, and a non-display area outside the display area; and a cover disposed over the display panel so as to cover the display area of the display panel. The cover comprises at least one electrically conductive portion coupled to the at least one power line and configured to receive at least one power supply voltage via the non-display area, and supply the at least one power supply voltage to the at least one power line in the display area.

In one or more embodiments, the display device further comprises at least one source driving IC in the non-display area at a first side of the display area, coupled to the at least one electrically conductive portion of the cover and configured to supply the at least one power supply voltage to the at least one electrically conductive portion.

In one or more embodiments, the at least one power line is connected to the at least one electrically conductive portion of the cover at a second side of the display area that is opposite the first side of the display area.

In one or more embodiments, the display device further comprises at least one common electrode in the non-display area at the second side of the display area, connecting the at least one power line to the at least one electrically conductive portion. The at least one common electrode may comprise at least one contact hole. The display device may further comprise a conductive material electrically connecting the contact hole with the at least one electrically conductive portion of the cover.

In one or more embodiments, the display device further comprises at least one pad in the non-display area at the first side of the display area, electrically coupled to the at least one source driving IC and comprising at least one area configured to receive a data signal. The at least one pad may be free from a power supply voltage receiving area.

In one or more embodiments, the at least one pad is configured to receive the at least one power supply voltage from outside and the at least one source driving IC is configured to receive the at least one power supply voltage via the at least one pad; or the at least one source driving IC is configured to receive the at least one power supply voltage from outside and supply the at least one power supply voltage to the display area through the at least one pad. The at least one pad may be in contact with the at least one electrically conductive portion of the cover.

In one or more embodiments, the display device further comprises a data driving unit coupled to the at least one pad and configured to provide at least one data signal to the at least one pad.

In one or more embodiments, the display device further comprises at least one additional power line in the display area, coupled to the at least one source driving IC at the first side of the display area so as to receive the at least one power supply voltage directly from the at least one source driving IC without the at least one electrically conductive portion of the cover coupled in-between.

In one or more embodiments, the at least one electrically conductive portion comprises a first portion and a second portion electrically insulated from the first portion, wherein the at least one power line comprises a first power line coupled to the first portion and a second power line coupled to the second portion, and wherein the first portion is configured to receive a first power supply voltage and the second portion is configured to receive a second power supply voltage that is different from the first power supply voltage.

In one or more embodiments, the cover comprises a metal encapsulation, wherein the at least one electrically conductive portion comprises at least one portion of the metal encapsulation.

In one or more embodiments, the metal encapsulation comprises a first portion and a second portion, wherein an electrically insulating region is disposed between the first portion and the second portion so as to insulate the first portion from the second portion.

In one or more embodiments, the cover comprises an insulating layer coated with a conductive layer. The conductive layer may comprise a metal or a metal alloy. The conductive layer may be coated with an additional insulating layer.

In one or more embodiments, the conductive layer comprises a first portion and a second portion, wherein an electrically insulating region is disposed between the first portion and the second portion so as to insulate the first portion from the second portion.

In one or more embodiments, the at least one power line comprises a first power line coupled to the first portion and a second power line coupled to the second portion, wherein the first portion is configured to receive an upper power supply voltage and supply the upper power supply voltage to the first power line, and wherein the second portion is configured to receive a lower power supply voltage and supply the lower power supply voltage to the second power line. A first contact hole may be provided to connect the first power line to the first portion, and a second contact hole may be provided to connect the second power line to the second portion.

In one or more embodiments, the display device further comprises: a first conductive line in the non-display area extending from the first side of the display area to the second side of the display area; a second conductive line in the non-display area at the second side of the display area, connected to the first conductive line, wherein the at least one electrically conductive portion of the cover is configured to receive a first power supply voltage, wherein the first conductive line is configured to receive a second power supply voltage that is different from the first power supply voltage, and wherein the second conductive line is configured to supply the second power supply voltage to the display area. The first power supply voltage may be an upper power supply voltage and the second power supply voltage may be a lower power supply voltage.

In one or more embodiments, the display device is configured as an organic light emitting display device, wherein the at least one electrically conductive portion of the cover comprises a metal encapsulation coupled to a cathode of the display device. The cathode may be formed to extend to the metal encapsulation and may be electrically connected to the metal encapsulation by means of an electrically conductive material in contact with an outer side of the cathode and the metal encapsulation, or the cathode may be electrically connected to the metal encapsulation by means of an adhesive film disposed between the cathode and the metal encapsulation and having an electrically conductive material dispersed within the adhesive film.

BRIEF DESCRIPTION OF THE DRAWINGS

The above and other objects, features and advantages of the present embodiments will be more apparent from the following detailed description taken in conjunction with the accompanying drawings.

DETAILED DESCRIPTION

Figure 1:
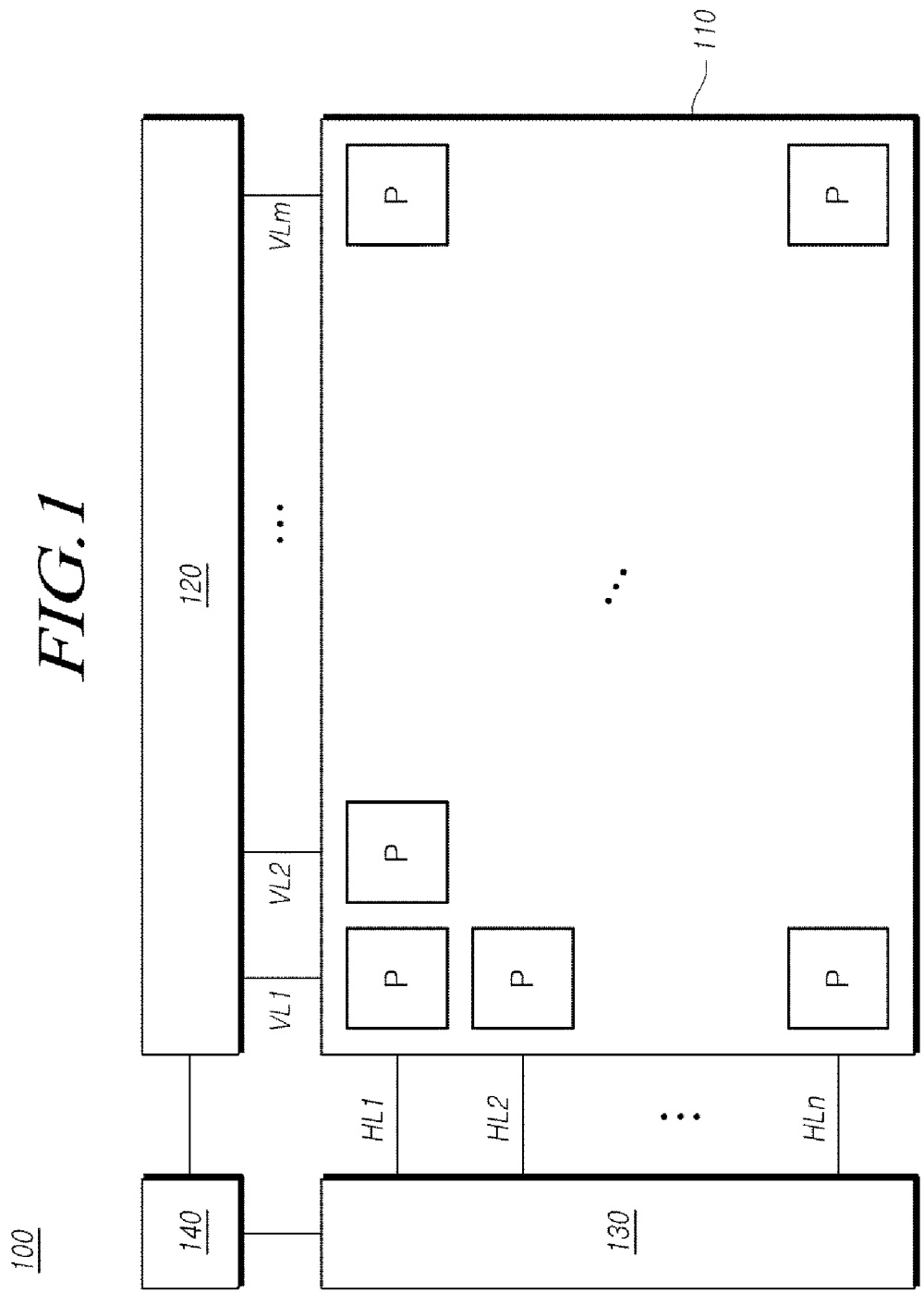
FIG. 1 schematically illustrates a display device according to embodiments of the present disclosure.

Hereinafter, embodiments of the present disclosure will be described with reference to the accompanying drawings. In the drawings, the identical element may consequently bear the same reference numerals of the previous drawings. In the present specification, a detailed description of well-known functions and configurations will be omitted so as not to make the scope of the present invention unclear.

In addition, the term, such as "the first," "the second," "A," "B," "(a)," or "b," may be used in order to describe elements of the present invention. The terms may be used merely for the purpose of distinguishing an element from other elements, but may not be construed to limit the characteristics, the order, the sequence, or the numbers of corresponding elements. When an element is referred to as being "connected," "combined," or "linked" with another element, it should be understood that the element may be directly connected or linked with another element, but still another element may be "interposed" between them, or the elements may be "connected," "combined," or "linked" with each other through another element.

FIG. 1 schematically illustrates a display device according to embodiments of the present disclosure.

Referring to FIG. 1, the display device 100, according to embodiments, may include a display panel 110, in which a plurality of first lines VL1 to VLm is formed in a first direction (e.g., a vertical direction) and a plurality of second lines HL1 to HLn is formed in a second direction (e.g., a horizontal direction), a first driving unit 120 that provides first signals to the plurality of first lines VL1 to VLm, a second driving unit 130 that provides second signals to the plurality of second lines HL1 to HLn, and a timing controller 140 that controls the first driving unit 120 and the second driving unit 130.

In the display panel 110, a plurality of pixels "P" may be defined by intersections of the plurality of first lines VL1 to VLm in the first direction (e.g. the vertical direction) and the plurality of second lines HL1 to HLn in the second direction (e.g. the horizontal direction).

The first driving unit 120 and the second driving unit 130 set forth above may include at least one driver integrated circuit (IC) for outputting the first and second signals, e.g. image display signals.

The plurality of first lines VL1 to VLm formed on the display panel 110 in the first direction, for example, may be data lines that are formed in the vertical direction (the first direction) to transfer data voltages (the first signals) to the pixels in vertical rows, and the first driving unit 120 may be a data driving unit for supplying the data voltages to the data lines.

In addition, the plurality of second lines HL1 to HLn formed on the display panel 110 in the second direction may be gate lines that are formed in the horizontal direction (the second direction) to transfer scanning signals (the second signals) to the pixels in horizontal rows, and the second driving unit 130 may be a gate driving unit for supplying the scanning signals to the gate lines.

In addition, pads are formed on the display panel 110 to be linked with the first driving unit 120 and the second driving unit 130. The pads may transfer the first signals, which are supplied from the first driving unit 120 through the plurality of first lines VL1 to VLm, to the display panel 110, and may transfer the second signals, which are supplied from the second driving unit 130 through the plurality of second lines HL1~HLn, to the display panel 110 as well.

Elements for supplying the electric power are provided on the outside of the display panel 110. A secondary electric power may be supplied to the large scale display panel 110, or even to a small display panel for an equal power supply.

Figure 2:
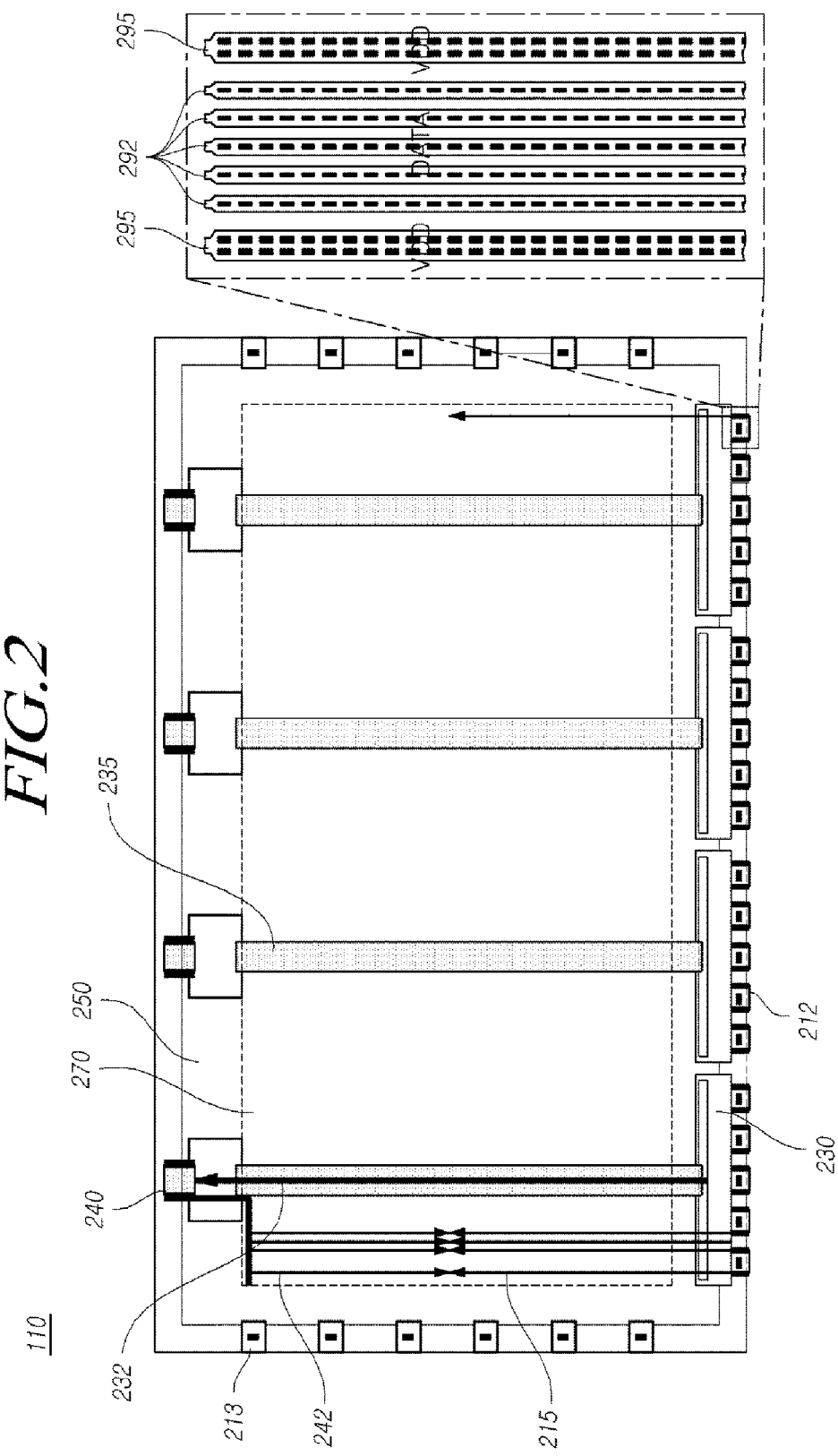
FIG. 2 illustrates a display panel adopting a secondary power supply unit, according to one or more embodiments.

FIG. 2 illustrates a display panel 110 adopting a secondary power supply unit. The display panel 110 may include a display area 270, and a source driving IC 230 that is positioned at a first side of the display area 270 to supply the main electrical power to the display area 270. In addition, the display panel 110 may further include a secondary power supply unit 240 that is connected with the source driving IC 230 through a power supply member 235 to be supplied with the electrical power therefrom. One or more source driving ICs 230 may be combined to (in other words, provided in) the display panel 110. One or more secondary power supply units 240 may be combined to (in other words, provided in) the display panel 110 as well. In an embodiment, the source driving IC 230 may be configured as a chip-on-film (COF). The source driving IC 230 may be connected with a source printed circuit board (PCB).

A pad 212 is connected with the source driving IC 230 to receive a signal from the first driving unit 120 of FIG. 1. As shown, a plurality of pads 212 may be connected with the source driving IC 230 in an embodiment. A pad 213 receives a signal from the second driving unit 130 of FIG. 1. If the first driving unit 120 is a data driving unit, the pad 212 may be a data pad; and if the second driving unit 130 is a gate driving unit, the pad 213 may be a gate pad.

The power supply member 235 may encompass various elements for supplying electrical power, such as metal cables, flexible flat cables (hereinafter, referred to as an "FFC"), or flexible printed circuits (FPC), but it is not limited thereto.

An encapsulation (also referred to as "encap") 250 may cover the display area 270 to separate the power supply member 235 from the display area.

In applying the structure of FIG. 2 to flat or curved display panels, such as organic light emitting display devices, the device may be designed as a single direction supply structure in which the power signal is applied through the side where the source driving IC 230 is positioned. In the case of large scale display panels or high resolution display panels, the secondary power supply unit 240 may be provided at a second side of the display area 270, which is opposite to the first side of the display area 270 where the source driving IC is disposed, to avoid or at least substantially reduce deterioration of the display quality due to a drop in a power signal (e.g., voltage drop in a power supply voltage) and to minimize a power loss.

In providing the secondary power supply unit at the second side of the display area 270 opposite to the first side of the display area 270 where the source driving IC 230 is disposed, in order to reduce a cost, the secondary power supply unit 240 may be connected with the source driving IC 230 through the power supply member 235 while the number of the source driving ICs 230 is maintained. In an embodiment, the secondary power supply unit may be configured using the FPC.

That is, as shown in the drawing, an upper power supply voltage (e.g. VDD) (herein also referred to as reference voltage or driving voltage) may be applied to the secondary power supply unit 240 through the power supply member 235 as indicated by an arrow 232, and then may be applied to the display area 270 as indicated by an arrow 242. In addition, the upper power supply voltage (VDD) is applied to the display area 270 through the pad 212 as indicated by an arrow 215.

The power signal is more important in the organic light emitting display device driven by a current. To this end, the secondary power supply unit 240 may be configured as two or more reference voltage (VDD) lines and one or more ground voltage lines or, short, grounds in FIG. 2.

In the operation of the general organic light emitting display panel, the upper power supply voltage (e.g., VDD) (or the lower power supply voltage (e.g., VSS)) is applied through one side, i.e., the side where the source driving IC is positioned, whereas in developing large scale display panels or high resolution display panels, the electrical power is applied through the opposite side of the source driving IC using a secondary power supply unit without increasing the number of the source driving ICs to thereby minimize a power loss such as a VDD drop (or VSS drop).

Secondary power lines may be arranged at a specific interval in the panel, and a single secondary power supply unit may supply the electrical power evenly. When the current flowing to the panel increases due to an increase in the brightness or a malfunction of the panel, the heat emitted from the secondary power supply unit 240 increases accordingly thereto, which causes degradation of performance of the panel, such as deformation of a polarizing plate, or a change in performance of the devices.

In addition, in order to apply the electrical power through both sides of the panel, the pad 212 (e.g., each pad of a plurality of pads 212) is configured to receive a power signal (e.g., power supply voltage) as well as a data signal from the first driving unit 120, so the pad 212 has a complex structure in which one or more areas 295 for receiving a power signal (e.g., power supply voltage) and one or more areas 292 for receiving a data signal.

That is, each of the source driving ICs 230 may be configured to supply the electrical power in FIG. 2. When the separate power source is provided as described above, the size and the number of the chip-on-films (COFs) necessary for the lines for supplying the electrical power to the source driving IC 230 or the pad 212 may increase to thereby bring about an increase in the manufacturing cost of the panel, and a complicated configuration. Furthermore, the panel area applied with the electrical power may be burnt due to the heat developed by the electrical power. In addition, the size of a bezel may increase due to the need for designing a cable link for a power supply.

Hereinafter, an embodiment of the present disclosure will provide a configuration in which the secondary power source is removed, and the electrical power line is connected to the encapsulation area (encap area) of a cover. More specifically, according to one or more embodiments, the electrical power (e.g. an upper power supply voltage, e.g. VDD or EVDD; or a lower power supply voltage, e.g. a ground voltage or a low level voltage, e.g. VSS or EVSS) is supplied to a non-pad area of the panel through a metal encap area using a common electrode to thereby enable a stable and a robust power design. In addition, the elements, such as the cables for applying the electrical power to the panel through one side or both sides (e.g., opposite sides, e.g. first and second sides of the display area), and the COF, may be removed, and a power supply portion may be removed from the pad to thereby reduce the non-display area of the panel. Although the metal encap is disclosed as an example of the cover, which is applied with the electric power, in the present disclosure, the present embodiments are not limited thereto—for example, a non-conductive material (e.g., non-metallic material) coated with a conductive material may be adopted as the cover as well. The upper power supply voltage (driving voltage) (e.g., VDD or EVDD) or the lower power supply voltage (herein also referred to as ground voltage or base voltage) (e.g., VSS or EVSS) may be applied to the cover. The present disclosure provides an embodiment in which the upper power supply voltage (e.g., VDD or EVDD) or the lower power supply voltage (e.g., VSS or EVSS) may be applied to the cover, and then may be applied to the pad through a conductive material on the cover and the display panel in order to evenly transfer the same to the large scale display panel.

The display panel, according to the present disclosure, may include data lines that are formed on a substrate in the first direction for transferring data signals, gate lines that are formed on the substrate in the second direction for transferring gate signals, thin film transistors connected with the gate lines and the data lines, and a display area including pixels driven by the thin film transistors. The cover is positioned on the display panel to be connected with a first power line of the display area on one or more of the first side or the second side of the display panel. Here, if the first power is the upper power voltage (e.g., VDD or EVDD), the second power may be the lower power supply voltage (e.g., VSS or EVSS). On the contrary, if the first power is the lower power supply voltage (e.g., VSS or EVSS), the second power may be the upper power supply voltage (e.g., VDD or EVDD). Hereinafter, the description will be made of a configuration in which the upper power supply voltage or driving voltage (e.g., VDD or EVDD) is applied to the metal encap, which is one of the examples of the cover, but the disclosed features can be used in a configuration in which the lower power supply voltage (e.g., VSS or EVSS) is supplied to the metal encap as well. More specifically, the configuration in which the lower power supply voltage (e.g., VSS or EVSS) is supplied to the metal encap as an example of the cover will be described with reference to FIGS. 10 and 11.

Figure 3:
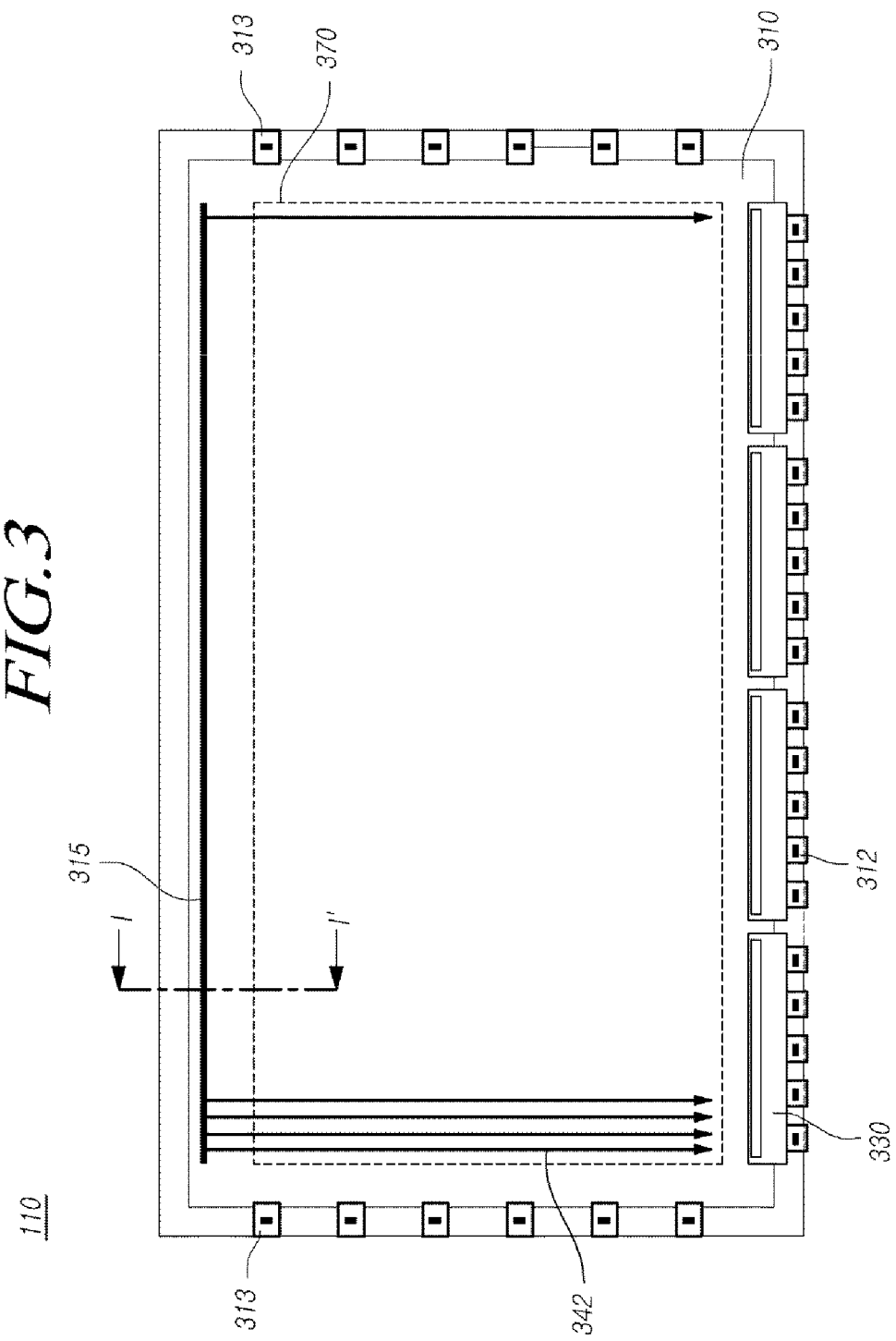
FIG. 3 illustrates a configuration of applying an upper power supply voltage (e.g. VDD) through a metal encapsulation ("encap") area according to an embodiment of the present disclosure.

FIG. 3 illustrates a configuration of applying the upper power supply voltage (e.g. VDD) through the metal encap area according to an embodiment of the present disclosure. Similar or same reference numerals as in FIG. 2 may denote similar or same elements as there.

The configuration shown in FIG. 3 includes display panel 110, metal encap 310, pads 312 and 313, common electrode (or contact hole) 315, source driving ICs 330, and display area 370. The pad 312 may receive a signal from the first driving unit 120 of FIG. 1, and the pad 313 may receive a signal from the second driving unit 130 of FIG. 1. If the first driving unit 120 is a data driving unit, the pad 312 may be a data pad, and if the second driving unit 130 is a gate driving unit, the pad 313 may be a gate pad. The gate pad 313 may be connected to the metal encap 310. In this case, a contact hole for applying the upper power supply voltage (e.g. VDD) from the metal encap 310 to the display area 370 may be selectively included, or an element connected to the contact hole on the panel 110 may be further provided. Here, the gate pad 313 may be connected with the metal encap 310 in a manner of a configuration set forth in FIG. 5 later.

The metal encap 310 may be provided with the upper power supply voltage (e.g. VDD) from the outside, for example, through a source PCB (not shown). The metal encap 310 may come into electric contact with a power line of the display area 370 through the common electrode (or the contact hole) 315. As a result, the upper power supply voltage (e.g. VDD) may be applied to the display area 370 as indicated by an arrow 342.

Figure 4:
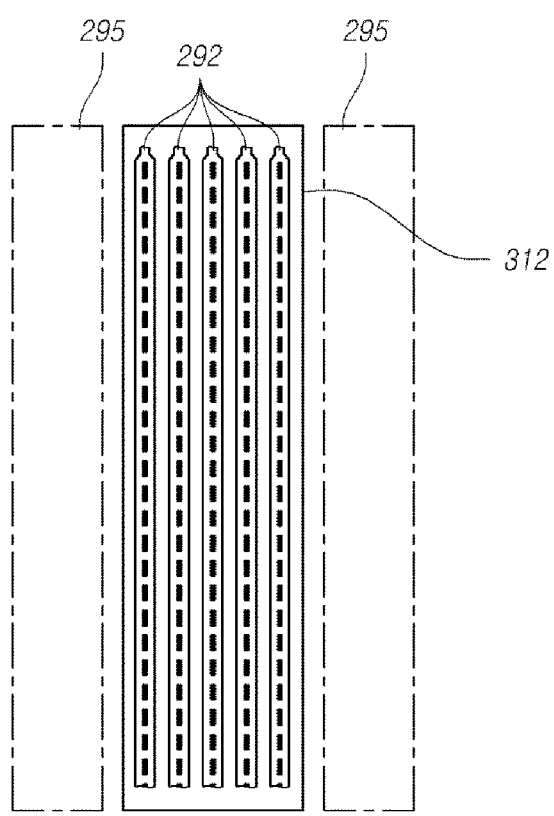
FIG. 4 is a detailed diagram of a pad illustrated in FIG. 3, according to one or more embodiments.

FIG. 4 is a detailed diagram of the pad 312 in FIG. 3. Since the one or more areas 295 where the upper power supply voltage (e.g. VDD) is applied are no longer required, the pad 312 of FIG. 4 includes only the one or more areas (e.g., lines) 292 for receiving a data signal. As a result, the width of the pad 312 can be reduced, and the number of areas (e.g., lines) 292 for receiving a data signal that can be provided in the same area may increase so that the number of COFs can be reduced.

Figure 5:
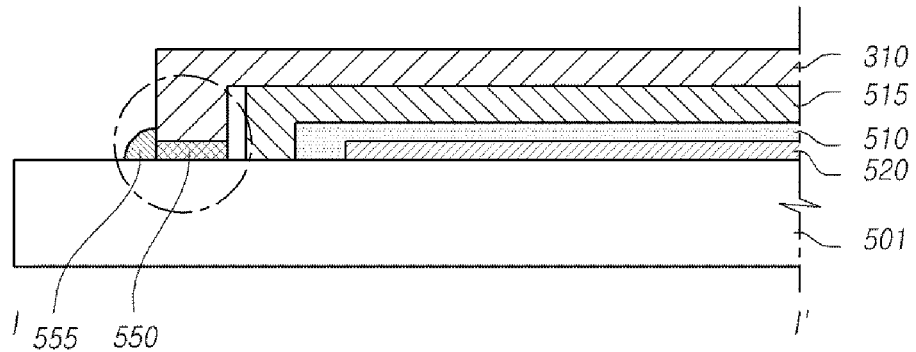
FIG. 5 illustrates a detailed configuration of applying the upper power supply voltage (e.g. VDD) to a metal encap according to an embodiment of the present disclosure.

FIG. 5 illustrates a detailed configuration of applying the upper power supply voltage (e.g. VDD) to the metal encap according to one or more embodiments. FIG. 5 shows a sectional view taken along the line I-I' of FIG. 3. The metal encap 310 may come into electric contact with the substrate 501 through a contact hole 550, which is an example of the common electrode (or contact hole) 315 in FIG. 3, and a conductive material 555 may electrically connect the contact hole 550 with the metal encap 310. More specifically, a cathode 520 is formed on the substrate 501, and an enclosing layer 510 including an organic material, and a face sealing adhesive (FSA) 515 are formed on the cathode 520. Meanwhile, the metal encap 310 is an example of a cover made of a conductive material. Alternatively, the cover may be made of a conductive material other than metal, or may include or may be made of a non-conductive material coated with a conductive material (e.g., metal), or may have a multi-layer structure including a conductive material (e.g., metal). This will be described in detail with reference to FIG. 12.

According to the configuration in which the upper power supply voltage (e.g. VDD) is supplied to the panel using the common electrode in FIGS. 3 to 5, burning of the pad and heat emission can be prevented. In addition, since the power supply member 235 and the secondary power supply unit 240, set forth in FIG. 2, may be removed from (in other words, omitted in) the display panel, the size of the bezel and the manufacturing cost can be reduced with an improved design. As shown in FIG. 4, the upper power supply voltage (e.g. VDD) area (e.g., line) in the pad 312 can be removed (in other words, omitted) to thereby reduce the width of the pad 312, and as a result, the number of COFs constituting the pad can be reduced to thereby lower the manufacturing cost.

In the embodiments of FIGS. 3 to 5, electric power (e.g., an upper power supply voltage VDD) is not applied directly to the display area 370 from the source driving IC 330. Instead, the electric power (e.g., upper power supply voltage VDD) is applied through the metal encap 310 and the common electrode (or contact hole) 315 as indicated by the arrow 342. However, in order to prevent a drop of the upper power supply voltage (e.g. VDD) in FIG. 3, a configuration of applying the upper power supply voltage (e.g. VDD) from the source driving IC 330 directly to the display area 370 may be included.

Figure 6:
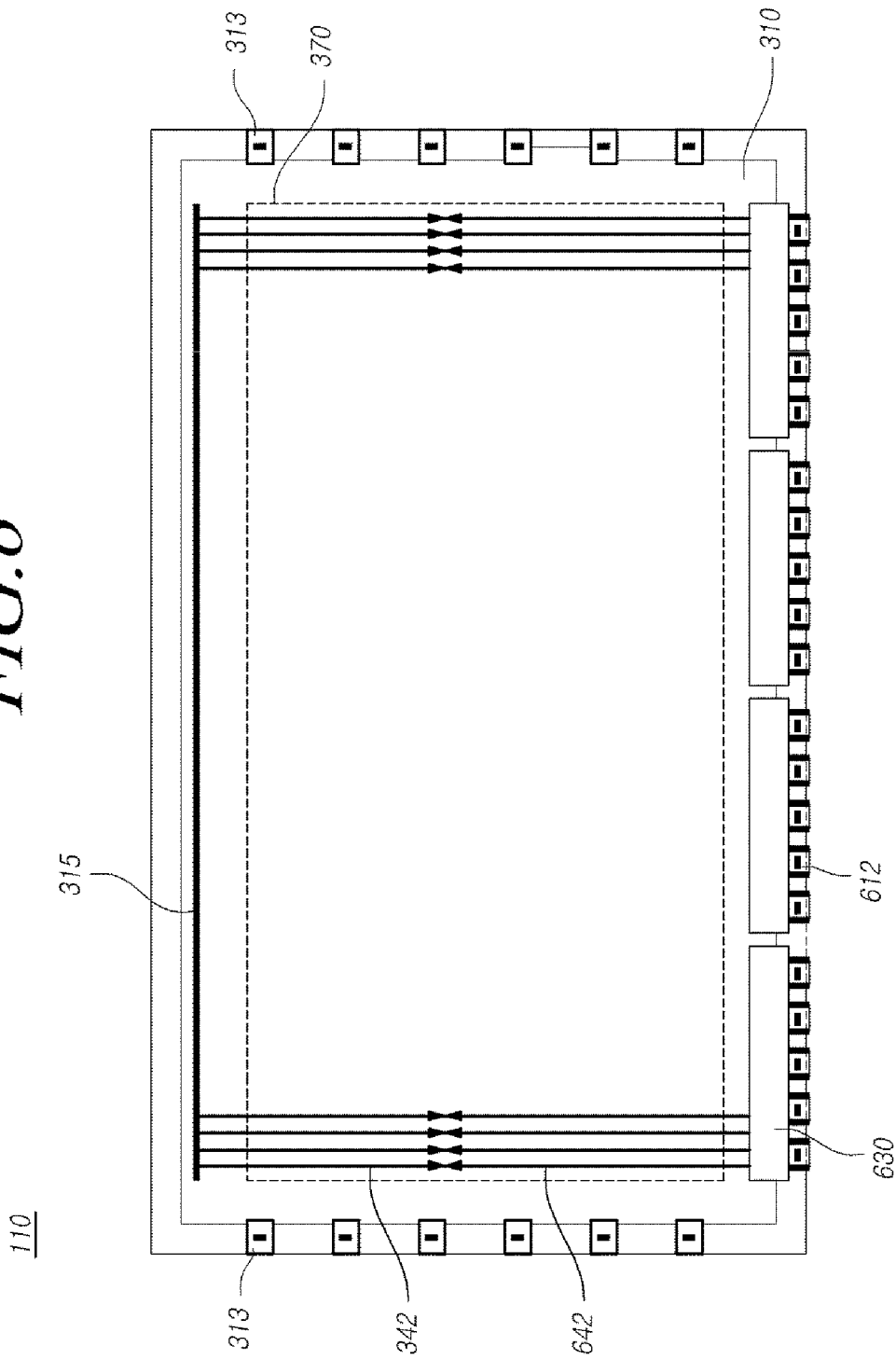
FIG. 6 illustrates a configuration of applying electrical power to a pad of a panel coupled to a source driving IC according to an embodiment of the present disclosure.

FIG. 6 illustrates a configuration of applying the electrical power (e.g., upper power supply voltage VDD) to a pad 612 of the panel 110 coupled to a source driving IC 630 according to an embodiment of the present disclosure. Referring to FIG. 6, the electrical power (e.g., upper power supply voltage VDD) is applied to the metal encap 310 and the display area 370 through the source driving IC 630 as shown by an arrow 642. The pad 612 may receive the electrical power (e.g., upper power supply voltage VDD) from outside, and the source driving IC 630 may receive the electrical power (e.g., upper power supply voltage VDD) via the pad 612. In addition, the metal encap 310 comes into contact with the common electrode (or contact hole) 315 so that the upper power supply voltage (e.g. VDD) is applied to the display area 370 as illustrated by the arrow 342. The arrows 342 and 642 denote the upper power supply voltage (e.g. VDD) that is applied to the display area 370.

Figure 7:
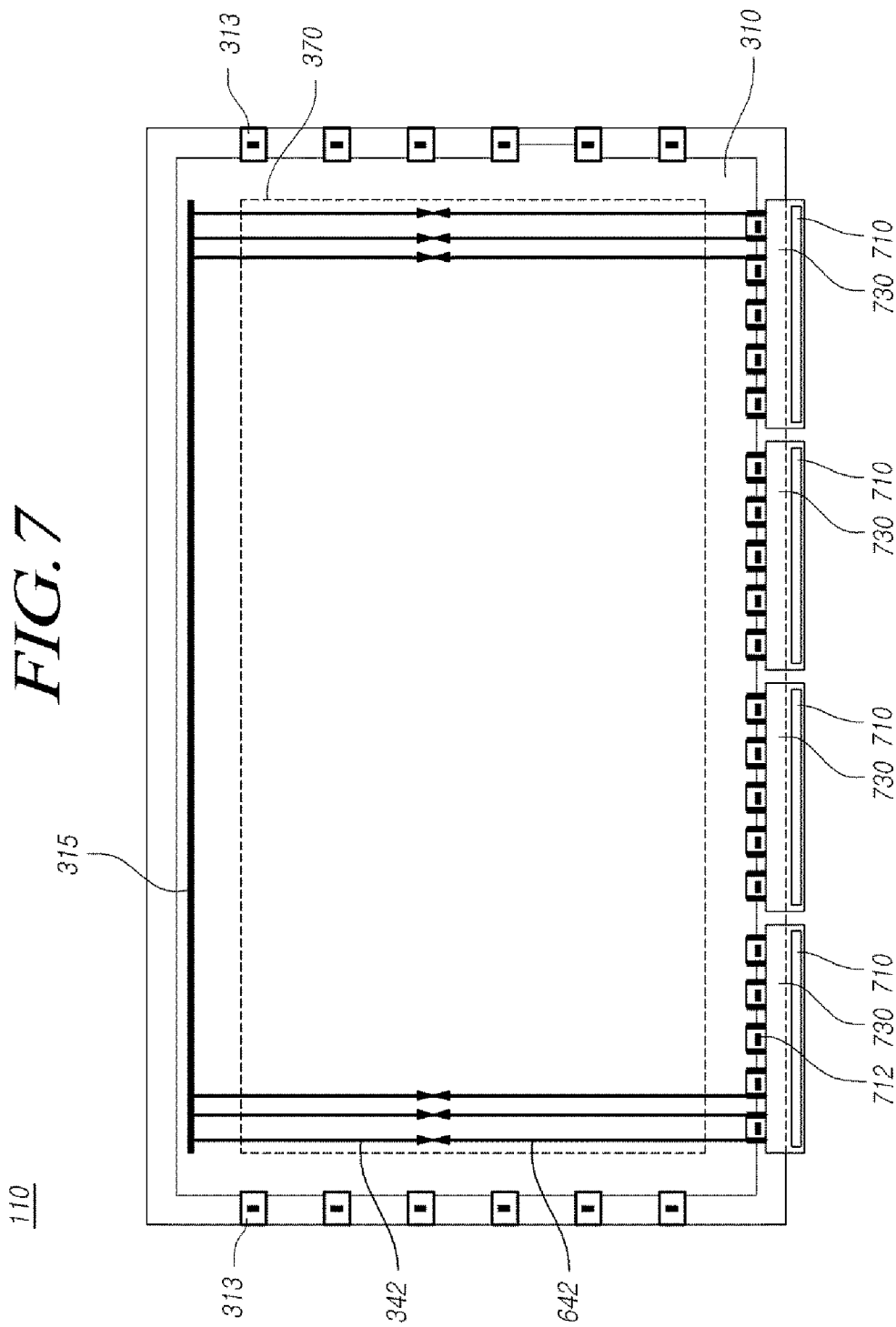
FIG. 7 illustrates a configuration in which a source driving IC applies the upper power supply voltage (e.g. VDD) to a metal encap through a pad according to an embodiment of the present disclosure.

FIG. 7 illustrates a configuration in which a source driving IC 730 applies the upper power supply voltage (e.g. VDD) to the metal encap 310 through the pad 712 according to an embodiment of the present disclosure. FIG. 7 shows the source driving IC 730 that is not folded, for convenience of explanation. The upper power supply voltage (e.g. VDD) is applied to the source driving IC 730 from outside the source driving IC 730, for example to an electrical contact of the source driving IC 730 (shown as a reference numeral 710 in FIG. 7), and then the upper power supply voltage (e.g. VDD) is applied to the display area 370 through the pad 712 connected with the source driving IC 730. Meanwhile, the pad 712 comes into electric contact with the metal encap 310 so that the upper power supply voltage (e.g. VDD) is applied to the metal encap 310 as set forth in FIG. 5. As a result, the upper power supply voltage (e.g. VDD) can be applied to the display area 370 through the common electrode (or contact hole) 315. Accordingly, the upper power supply voltage (e.g. VDD) can be applied through both sides of the panel (e.g., through the first and second sides, e.g. opposite sides, of the display area 370) as shown by the arrows 342 and 642 in FIG. 7. A conductive FSA or a conduction-supplementary material may be used for the electric contact between the metal encap 310 and the pad 712. The conduction-supplementary material may be a conductive material, a conductive tape, or an Ag-dot.

In FIG. 7, the upper power supply voltage (e.g. VDD) is applied to the display area 370 through the pad 712, and at the same time, the upper power supply voltage (e.g. VDD) is applied to the metal encap 310 through the electric contact between the pad 712 and the metal encap 310. With regard to the electric contact, the source driving IC 730 is electrically connected with the pad 712, and the pad 712 is electrically connected with the metal encap 310 as the cover so that the upper power supply voltage (e.g. VDD) is applied to the metal encap 310 through the source driving IC 730 and the pad 712.

Figure 8:
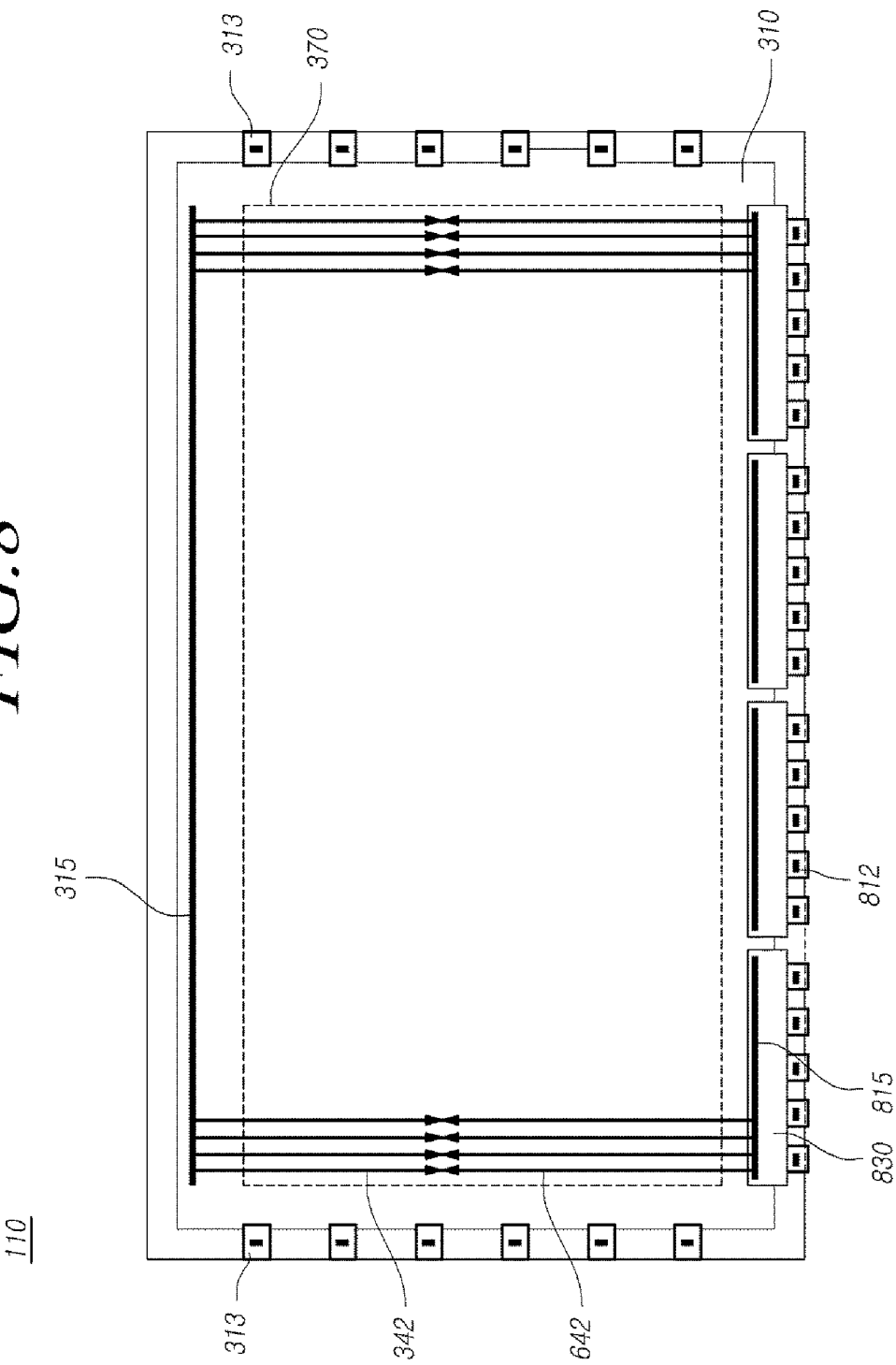
FIG. 8 illustrates a configuration in which a source driving IC applies electrical power directly to a metal encap according to another embodiment of the present disclosure.

FIG. 8 illustrates a configuration in which the source driving IC 830 applies the electrical power directly to the metal encap 310 according to another embodiment of the present disclosure.

FIG. 8 shows the source driving IC 830 that is folded. The upper power supply voltage (e.g. VDD) may be applied to the source driving IC 830 from the outside, for example through a source PCB (not shown), and the source driving IC 830 is electrically connected with the metal encap 310 through the member 815 so that the upper power supply voltage (e.g. VDD) may be applied to the metal encap 310. As a result, the upper power supply voltage (e.g. VDD) can be applied to the display area 370 through the common electrode (or contact hole) 315. Meanwhile, a conductive FSA or a conduction-supplementary material may be used for the electric contact between the metal encap 310 and the pad 812, as set forth in FIG. 5. The conduction-supplementary material may be a conductive material, a conductive tape, or an Ag-dot. That is, a first end of the metal encap 310 proximate the source driving IC 830 (and/or proximate the first side of the display area 370) and a second end of the metal encap 310 proximate the common electrode (or contact hole) 315 (and/or proximate the second side of the display area 370) are connected with the display panel 110 so that the upper power supply voltage (e.g. VDD) can be applied through both the first end and the second end as shown by the arrows 342 and 642. FIG. 8 shows a configuration in which the upper power supply voltage (e.g. VDD) is applied to the metal encap 310 through the electrical contact between the source driving IC 830 and the metal encap 310, and the upper power supply voltage (e.g. VDD) is applied to the display area 370 through the metal encap 310 on both the first and the second end thereof.

According to FIGS. 7 and 8, the upper power supply voltage (e.g. VDD) (or the lower power supply voltage (e.g. VSS)) may be applied through both sides of the display area 370 as shown by the arrows 342 and 642, that is, the upper power supply voltage (e.g. VDD) is applied to the metal encap 310 on one side through the source driving IC 730, 830, and the upper power supply voltage (e.g. VDD) is applied to the display area 370 from the metal encap 310 on the other side through the common electrode (or contact hole) 315, to thereby cope with the problem of the upper power supply voltage (e.g. VDD) drop in the large scale display panel.

In the configuration of applying the upper power supply voltage (e.g. VDD) to the metal encap as described above, the lower power supply voltage (e.g. VSS) may be applied through the data pad or may be configured in a manner of a line-on-glass (LOG) at the outside of the display area. To this end, a power line insulated from the cover may be formed on the display panel for supplying the lower power supply voltage (e.g. VSS). In the configuration of the LOG, the upper power supply voltage (e.g. VDD) is applied to the display area through the metal encap, and the lower power supply voltage (e.g. VSS) is applied to the display area through the line formed in the non-display area on the display panel, so an additional power line is not required to thereby reduce the thickness of the bezel. The lower power supply voltage (e.g. VSS) line may be formed to be insulated from the cover and the upper power supply voltage (e.g. VDD) line, and the lower power supply voltage (e.g. VSS)

may be applied through the opposite side. In another embodiment, the power supply member 235 for the secondary power of FIG. 2 may be formed on the metal encap 310 to be insulated therefrom. That is, the metal encap is applied with the electrical power together with the power supply member 235 for the secondary power to thereby secure a stable power supply. Considering that the power supply member 235 makes the configuration of the display panel complicated, either the configuration of providing a stable power supply or a simple configuration of the display panel may be selected, but the present embodiments are not limited thereto.

Figure 9:
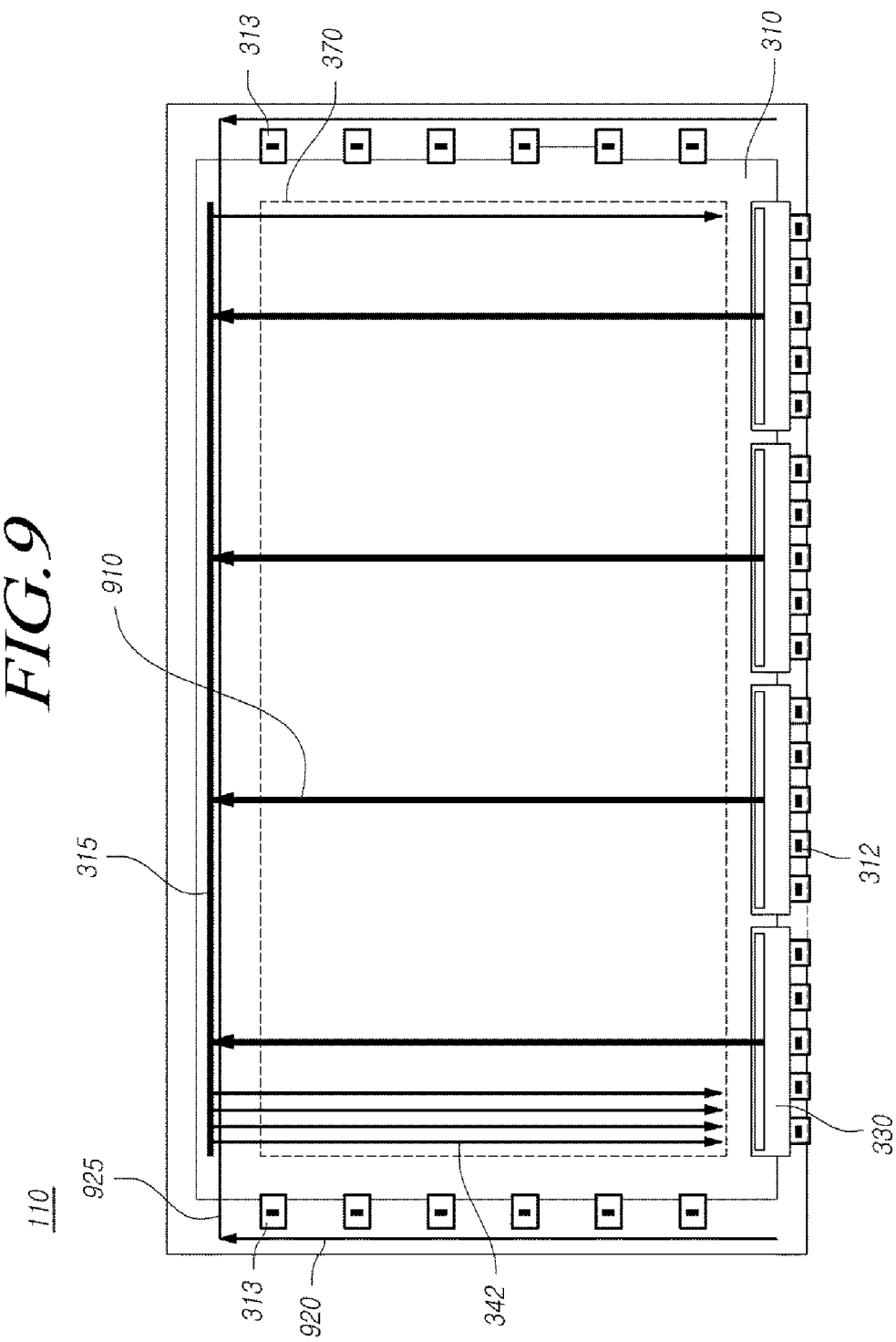
FIG. 9 illustrates a configuration in which a lower power supply voltage (e.g. VSS) is configured in a LOG type when the upper power supply voltage (e.g. VDD) is applied to a metal encap according to an embodiment of the present disclosure.

FIG. 9 illustrates a configuration in which the lower power supply voltage (e.g. VSS) is configured in the LOG type when the upper power supply voltage (e.g. VDD) is applied to the metal encap according to an embodiment of the present disclosure. The lower power supply voltage (e.g. VSS) of FIG. 3 may be connected to the line 920 in the LOG type. The upper power supply voltage (e.g. VDD) is applied to the metal encap 310 as shown by arrows 910 through the source driving IC 330 or the source PCB that is not shown in the drawing, and the upper power supply voltage (e.g. VDD) is applied to the panel through the common electrode 315 and then to the display area 370 as indicated by the arrows 342, as described above. Meanwhile, the lower power supply voltage (e.g. VSS) may be formed of the LOG lines 920 on the outside of the display area 370. In addition, the LOG line 920 is connected to the line 925 to apply the lower power supply voltage (e.g. VSS) to the display area 370. The metal encap 310, which is applied with the upper power supply voltage (e.g. VDD), may be insulated from the LOG line of the lower power supply voltage (e.g. VSS) formed on the outside of the metal encap 310. Alternatively, the lower power supply voltage (e.g. VSS) line may be configured in a different manner from the LOG type. For example, the lines for applying the lower power supply voltage (e.g. VSS) may be formed on the substrate, but the present disclosure is not limited thereto. In the configuration of FIG. 9, both the upper power supply voltage (e.g. VDD) and the lower power supply voltage (e.g. VSS) are applied through the opposite side of the source driving IC, so the space necessary for the upper power supply voltage (e.g. VDD) line and the lower power supply voltage (e.g. VSS) line on the data pad can be reduced. In addition, in the case of the large scale display panel, the upper power supply voltage (e.g. VDD) and the lower power supply voltage (e.g. VSS) may be selectively configured to be applied through the source driving IC as well. In this case, the problems of the upper power supply voltage (e.g. VDD) drop and the lower power supply voltage (e.g. VSS) drop resulting from the large scale display panel can be overcome.

Although, embodiments for applying the upper power supply voltage or driving voltage (e.g. the VDD or the EVDD) to the metal encap have been described, a lower power supply voltage or base voltage (e.g. the VSS or the EVSS) may be applied to the metal encap as well. In this case, the upper power supply voltage (e.g. VDD) may be applied in the manner of FIG. 2, or may be applied to the pixel area in the display panel from the source driving IC and the pad. The connection of the metal encap and the cathode in the case of applying the lower power supply voltage (e.g. VSS) to the display area as shown in FIGS. 3 to 8 will be described in detail.

Figure 10:
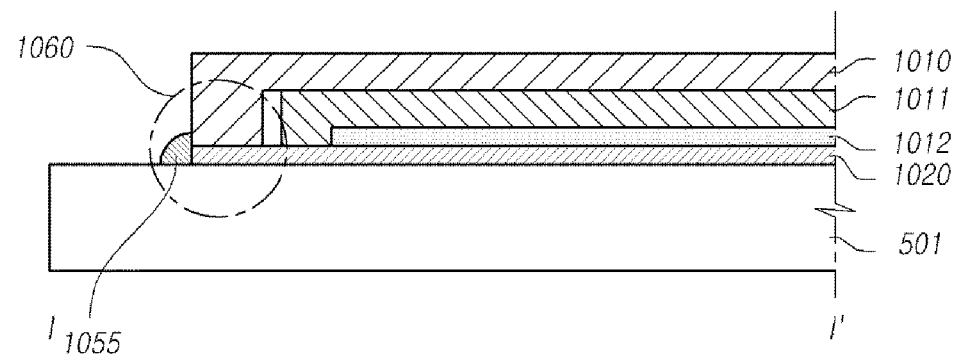
FIG. 10 illustrates a configuration of electrically connecting the lower power supply voltage (e.g. VSS) applied to a metal encap and a cathode by making them come into physical contact with each other according to an embodiment of the present disclosure.

FIG. 10 illustrates a configuration of electrically connecting the lower power supply voltage (e.g. VSS) applied to the metal encap and a cathode by making them come into physical contact with each other according to an embodiment of the present invention. FIG. 10 shows an alternative embodiment with a sectional view taken along the line I-I' of FIG. 3. FIG. 10 shows that a line connected with the cathode 1020 of the display area extends to the boundary of the metal encap 1010 as the cover to be connected to a conductive material. The metal encap 1010 and the cathode 1020 come into electric contact with each other though a conductive material 1055. The cathode 1020 may be formed to extend to the metal encap 1010 for the electric contact. The conductive material 1055 may be in contact with the cathode 1020 and with the metal encap 1010. The conductive material 1055 may be formed at (in physical contact with) an outer side of the cathode 1020 and the metal encap 1010. As indicated by a reference numeral 1060, the conductive material 1055 may be in physical contact with the cathode 1020 and the metal encap 1010. As a result, the lower power supply voltage (e.g. VSS) may be applied to the cathode 1020 through the metal encap 1010. More specifically, the cathode 1020 may be formed on the substrate, and an OLED layer 1012 and a face sealing adhesive FSA 1011 may be formed on the cathode 1020. The OLED layer 1012 may be formed on the cathode 1020, and the FSA 1011 may be formed on the OLED layer 1012. A portion of the FSA 1011 may be formed on the cathode 1020, as shown.

Figure 11:
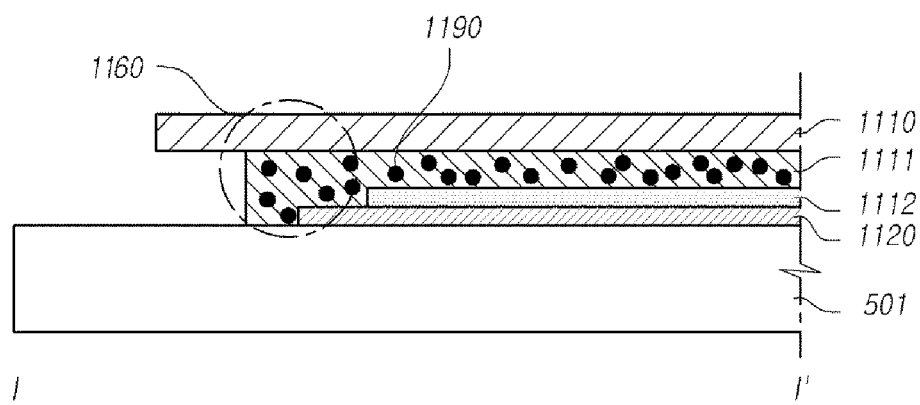
FIG. 11 illustrates a configuration of electrically connecting the lower power supply voltage (e.g. VSS) applied to a metal encap and a cathode by making them physically contact each other according to an embodiment of the present disclosure.

FIG. 11 illustrates a configuration of electrically connecting the lower power supply voltage (e.g. VSS) applied to a metal encap and a cathode by making them come into physical contact with each other according to an embodiment of the present disclosure. FIG. 11 shows an alternative embodiment with a sectional view taken along the line I-I' of FIG. 3. The cathode 1120 of the display area and an adhesive layer under the metal encap 1110 as the cover are electrically connected with each other. The adhesive layer includes a conductive material, so the lower power supply voltage (e.g. VSS or EVSS) applied to the metal encap may be applied to the cathode through an adhesive film 1111 that is an example of the adhesive layer. A conductive material 1190 may be dispersed in the adhesive film 1111 as indicated by a reference numeral 1160. Therefore, the cathode 1120 and the adhesive film 1111 are electrically connected with each other, and the adhesive film 1111 and the metal encap 1110 are electrically connected with each other, so the lower power supply voltage (e.g. VSS) applied to the metal encap 1110 can be applied to the cathode. An OLED layer 1112 may be disposed between a portion of the cathode 1120 and the adhesive film 1111.

In the configuration of FIGS. 10 and 11, since the lower power supply voltage (e.g. VSS) is applied to the metal encap 1010 or 1110, like the case of the upper power supply voltage (e.g. VDD) above, the lower power supply voltage (e.g. VSS) area can be removed from the source driving IC. As a result, the lower power supply voltage (e.g. VSS) area may be removed from the pad, such as the data pad, to which the lower power supply voltage (e.g. VSS) is applied, and thus the number of pads can be reduced. In addition, the removal of the lower power supply voltage (e.g. VSS) from the pad can prevent the pad from being burnt, and can reduce the size of the bezel. Particularly, in the case of the adhesive layer including a conductive layer as shown in FIG. 11, the cathode is not required to be extended to the outside, and it is unnecessary to precisely align the metal encap 1110 with the contact hole.

The cover set forth above in FIGS. 5, 10, and 11, is configured as the metal encap that is a conductive metal. Once the electrical power is applied to the metal encap, the overall cover may be applied with the electrical power. In addition, the metal encap needs to be insulated from the display area.

Figure 12:
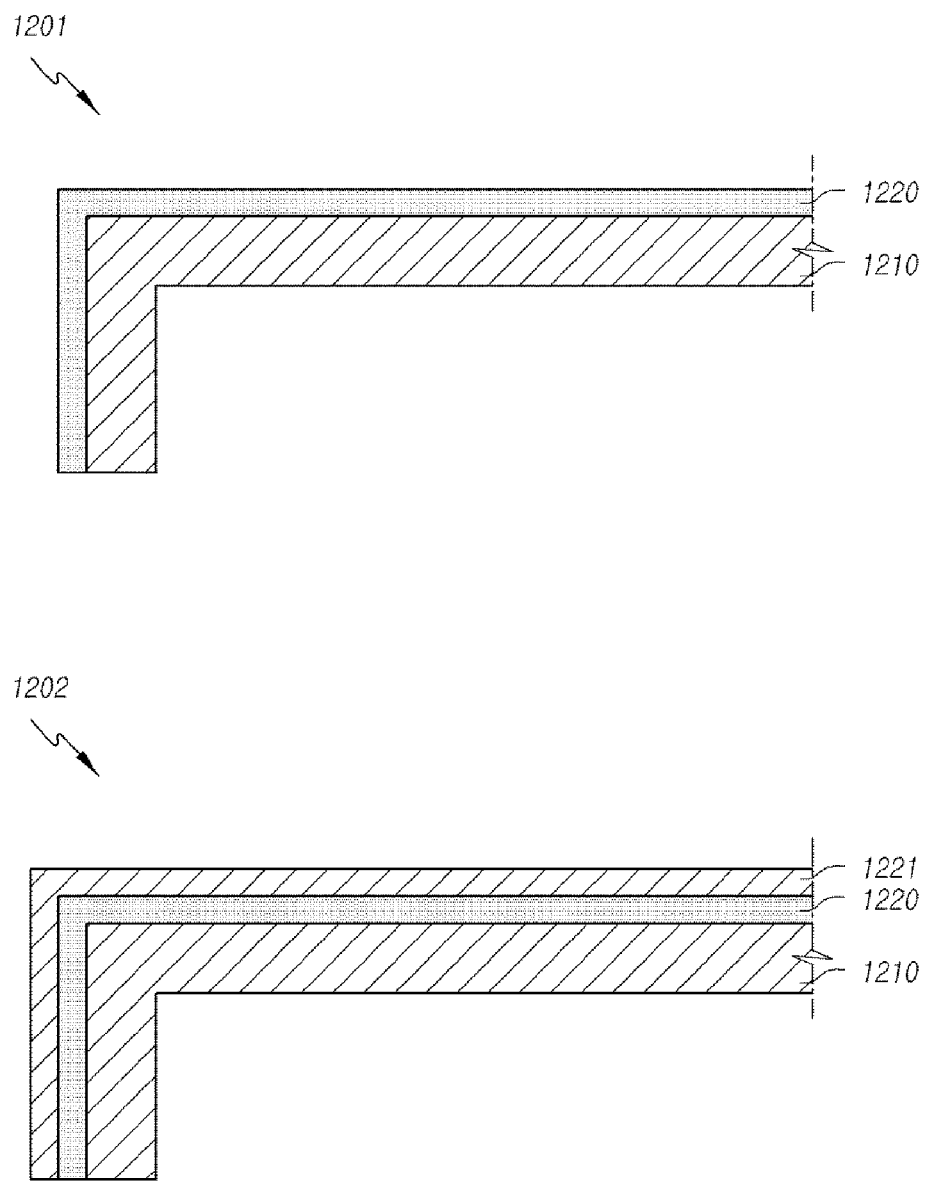
FIG. 12 is a configuration of a cover according to another embodiment of the present disclosure.

FIG. 12 is a configuration of a cover according to another embodiment of the present disclosure. The cover may have a multi-layer structure. As shown in structure 1201, a conductive metal layer is coated on the cover, or a thin metal film may be attached to the outer surface of the cover. The metal layer or the metal substrate may be attached to the outer surface of the cover as indicated by a reference numeral 1220. An insulation material 1210 may be provided inside the cover. In other words, the cover may include an insulation material, layer or substrate 1210 disposed at an inner side of the cover, and a conductive metal layer or substrate 1220 disposed at an outer side of the cover. As shown in structure 1202, the insulation substrate or the insulation material 1210 and 1221 may be formed on the outer surface and the inner surface of the conductive metal layer or metal substrate 1220 to form a three-layer structure. In other words, in the embodiment shown in diagram 1202, the cover may include a conductive metal layer or substrate 1220 disposed between two insulating materials, layers or substrates 1210 and 1221. According to the configurations of the multi-layered cover in FIG. 12, since the metal layer or the thin metal substrate constitutes at least a portion of the cover, the weight of the cover can be reduced, and an additional element for insulating the same is not required. More specifically, when a conductive material (e.g., metal) is coated on the cover as shown in structure 1201, the encap may include a conductive material in part. In other words, only a portion or a plurality of portions of the insulation material 1210 may be coated with the conductive material (e.g., metal). A conductive material may be patterned to be different according to the position of the applied upper power supply voltage (e.g. VDD) or the lower power supply voltage (e.g. VSS), or may be deposited on the insulation layer 1210 to be different according to the circuit configuration in the display area. In other words, locations where the conductive material (e.g., metal) is provided (e.g., locations of the insulation layer 1210 coated with the conductive material) may depend on positions where upper power supply voltage (e.g. VDD) and/or the lower power supply voltage (e.g. VSS) may be supplied, and/or on the circuit configuration in the display area.

Figure 13:
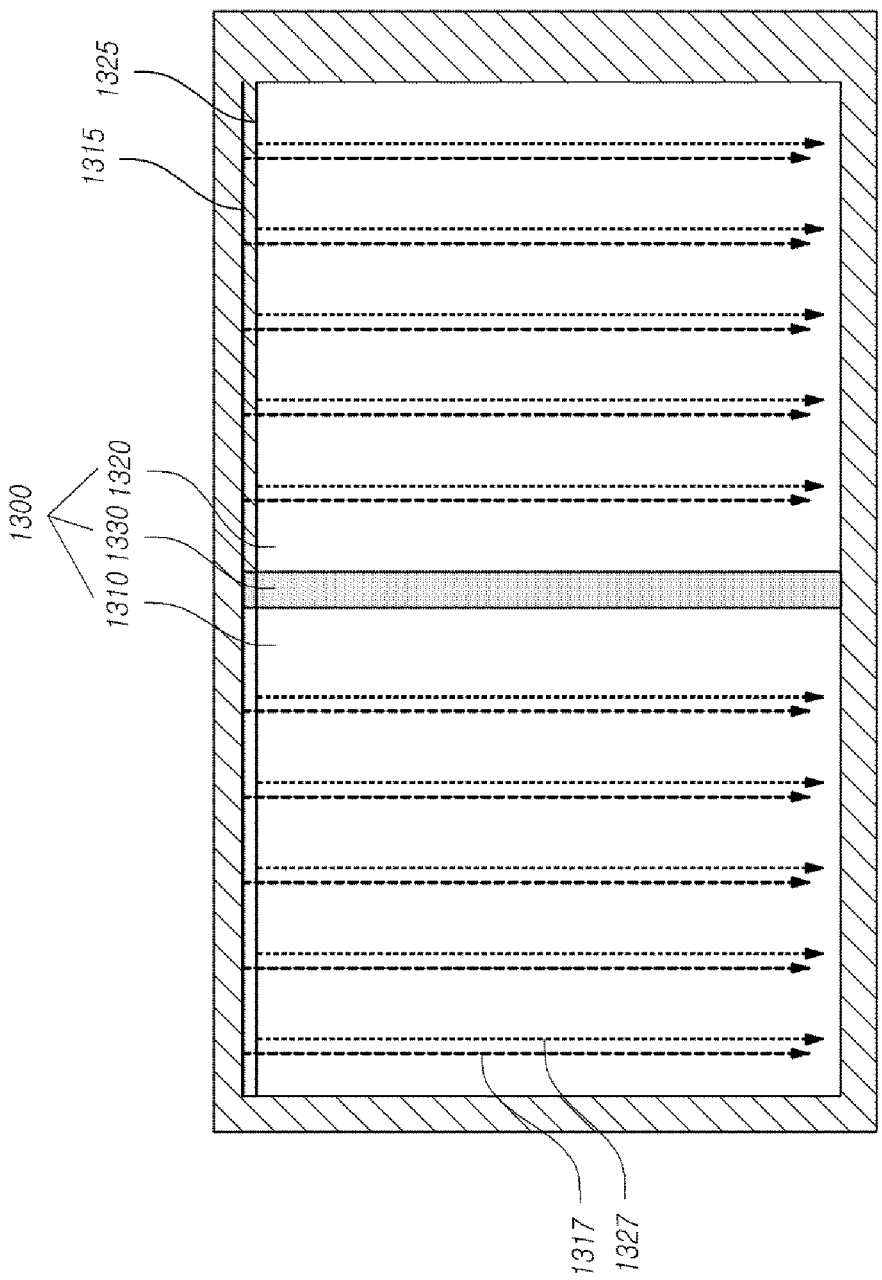
FIGS. 13 to 15 illustrate a configuration of applying the upper power supply voltage (e.g. VDD) and the lower power supply voltage (e.g. VSS) to a metal encap according to another embodiment of the present disclosure.
Figure 14:
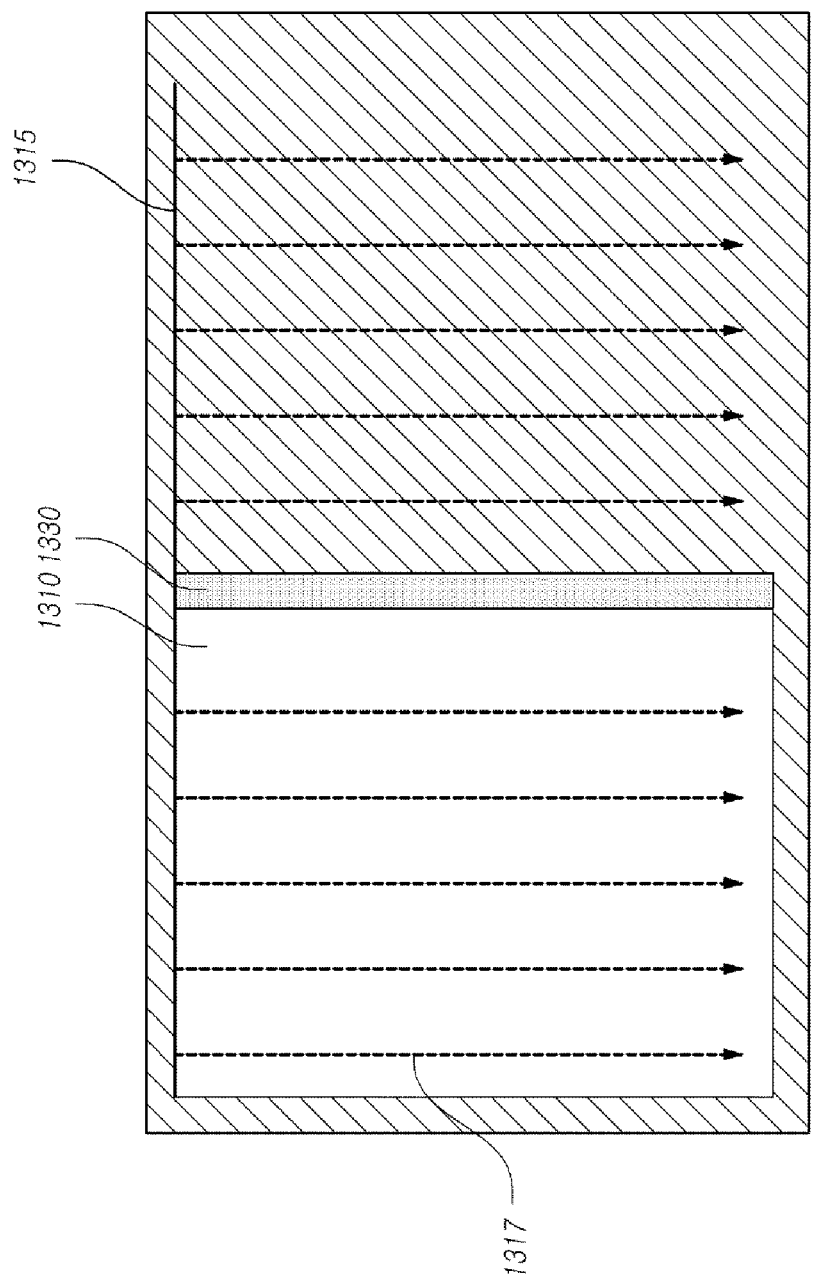
Figure 15:
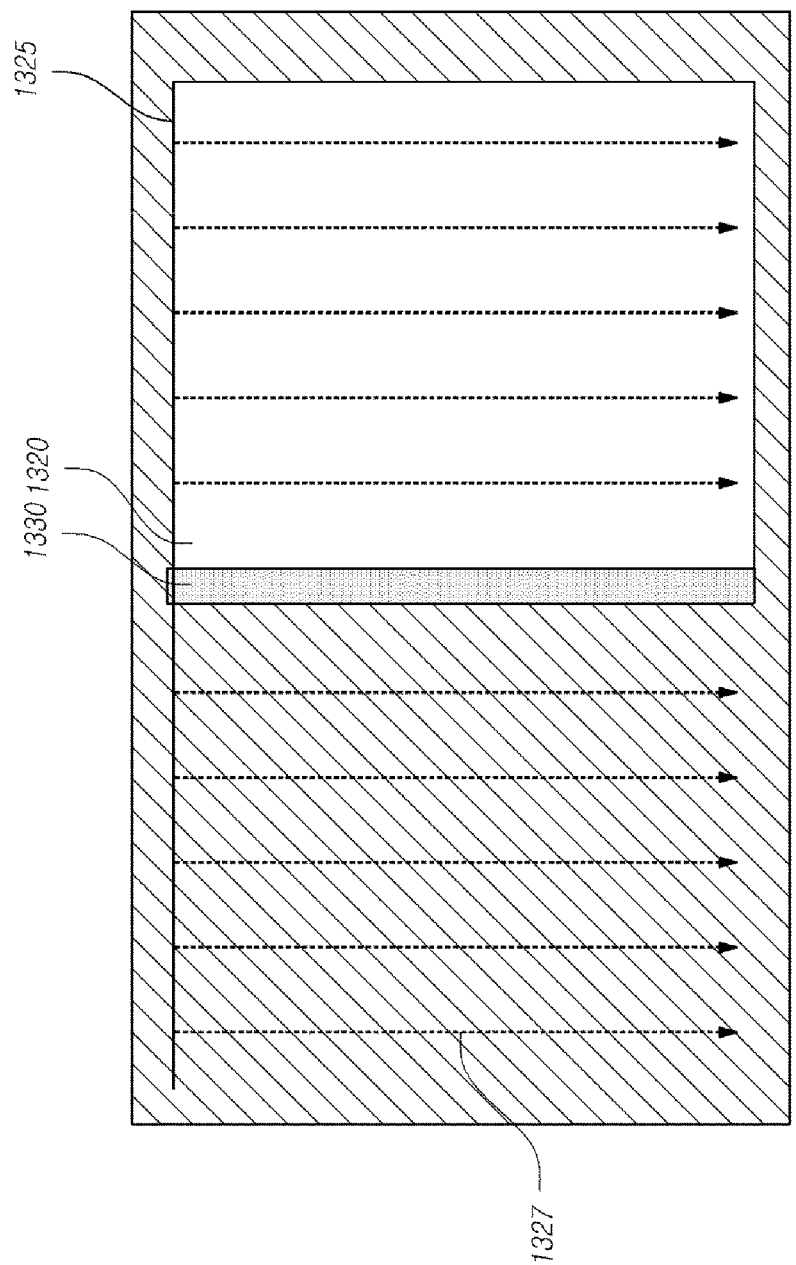

FIGS. 13 to 15 illustrate configurations of applying the upper power supply voltage (e.g. VDD) and the lower power supply voltage (e.g. VSS) to the metal encap according to another embodiment of the present invention.

If the metal encap is divided into two parts, and the central area between them is insulating, two kinds of electrical power may be applied to the metal encap. For example, as set forth in structure 1201 of FIG. 12 above, if the substrate is coated with a conductive material (e.g., if two separate portions of the substrate are coated with the conductive material (e.g., metal)), or if two metal substrates and one insulation substrate are combined to a single substrate, the upper power supply voltage (e.g. VDD) and the lower power supply voltage (e.g. VSS) may be applied to the respective metal substrates (or metal material). According to the present disclosure, two kinds of electrical power may be applied through the metal encap. For convenience of explanation, the display area under the cover 1300 will not be shown here.

More specifically, in the metal encap of FIG. 13, the cover 1300 is comprised of the first conductive layer 1310, which is coated or positioned on the first area, the second conductive layer 1320, which is coated or positioned on the second area, and an insulation portion 1330, which insulates the conductive layers from each other. In addition, the electrical power applied to the first conductive layer 1310 is applied to the display area through the contact hole 1315 as indicated by arrows 1317, and the electrical power applied to the second conductive layer 1320 is applied to the display area through the contact hole 1325 as indicated by arrows 1327. Accordingly, two kinds of electrical power can be applied through two metal encaps 1310 and 1320, which are insulated, in the cover 1300.

FIG. 14 shows the first conductive layer 1310 and the insulation portion 1330 for convenience of explanation. The first conductive layer 1310 formed in the first area of the cover 1300 may be applied with the upper power supply voltage (e.g. VDD or EVDD), and the upper power supply voltage (e.g. VDD or EVDD) is applied to the display area through the contact hole 1315. Although the first conductive layer 1310 occupies about half of the display area, since the contact hole 1315 extends through the entire width of the display area, the upper power supply voltage (e.g. VDD or EVDD) can be applied to the overall display area.

FIG. 15 shows the second conductive layer 1320 and the insulation portion 1330 for convenience of explanation. The second conductive layer 1320 formed in the second area of the cover 1300 may be applied with the lower power supply voltage (e.g. VSS or EVSS), and the lower power supply voltage (e.g. VSS or EVSS) is applied to the display area through the contact hole 1325. Although the second conductive layer 1320 occupies about half of the display area, since the contact hole 1325 extends through the entire width of the display area, the lower power supply voltage (e.g. VSS or EVSS) can be applied to the overall display area.

As shown in FIGS. 14 and 15, each conductive layer is connected through the power line and the contact hole, through which the electrical power is applied to the display area. To this end, the power lines in the display area may be configured in different layers. In some embodiments, although two kinds of electrical power, i.e., the upper power supply voltage (e.g. VDD or EVDD) and the lower power supply voltage (e.g. VSS or EVSS), are applied, separate power cables are not required to be provided on the outside of the data pad or the cover. Accordingly, the complicated cables may be removed from the display panel, the performance and a stable power supply of the display panel can be obtained.

According to the configuration of FIGS. 13 to 15, since two kinds of electrical power can be applied to a single cover, separate lines for the lower power supply voltage (e.g. VSS) or the upper power supply voltage (e.g. VDD) need not to be formed on the outside of the cover, so they can be configured integrally. The occupying ratio of two conductive layers 1310 and 1320 to the cover 1300 may vary with the type of electrical power to be applied or the properties thereof. In addition, the positions of the contact holes 1315 and 1325, which come into contact with the conductive layers, may be varied, and the conductive layer may have two or more contact holes in order to supply the electrical power evenly to the display panel. Although two conductive layers are separated from each other on the same layer in FIGS. 13 to 15, the present embodiments are not limited thereto, and the conductive layers may be formed of a multi-layer with the insulation layer interposed therebetween.

Meanwhile, the cover is configured as structure 1201 of FIG. 12 so that the first conductive layer and the second conductive layer are separated based thereon, and an insulation area 1330 may be formed between the same. In this case, the thickness of the bezel can be reduced while two kinds of electrical power can be applied to the cover. The first and the second conductive layers in each area are not limited to a rectangular shape, and they may be positioned to be parallel to each other in the form of stripes, so that the heat emission due to applying the electrical power can be reduced with the decrease in the size of the bezel.

According to the configuration above, the power connection of the upper power supply voltage (e.g. VDD or EVDD) or the lower power supply voltage (e.g. VSS or EVSS) for controlling the organic light emitting layers can be simplified, and a stable power supply can be secured. That is, since the upper power supply voltage (e.g. VDD or EVDD) (or the lower power supply voltage (e.g. VSS or EVSS)) is applied to the panel through the cover, the conventional secondary cables for the flexible flat cables (FFC) can be removed with a stable power supply. According to an embodiment of the present disclosure, the electrical power is supplied to the non-pad area of the panel through the common electrode to thereby enable a stable and robust power design. In addition, the additional secondary power cables and the power lines of the source driving IC (the chip-on-film, COF) may be removed to thereby reduce the number of COFs and the thickness of the non-display area of the panel.

While the present disclosure has been particularly shown and described with reference to exemplary embodiments thereof, it will be understood by those skilled in the art that various changes and modifications, such as combination, division, or replacement of elements, in forms and details may be made therein without departing from the spirit and scope of the present disclosure as defined by the appended claims. Therefore, it should be understood that the embodiments of the present specification are not intended to limit the present disclosure to particular forms. The scope of the present disclosure should be construed by the appended claims, and it should be construed to encompass all modifications, equivalents, and/or alternatives falling within the spirit and scope of the present disclosure.

What is claimed is:

1. A display device, comprising:
a display panel having a display area, in which a plurality of pixels and at least one power line for supplying power to the pixels are formed, and a non-display area outside the display area;
a cover disposed over the display panel so as to cover the display area of the display panel, and
at least one source driving IC in the non-display area at a first side of the display area,
wherein the cover comprises at least one electrically conductive portion coupled to the at least one power line and configured to receive at least one power supply voltage via the non-display area, and supply the at least one power supply voltage to the at least one power line in the display area; and
wherein the source driving IC is coupled to the at least one electrically conductive portion of the cover and configured to supply the at least one power supply voltage to the at least one electrically conductive portion.

2. The display device of claim 1, wherein the at least one power line is connected to the at least one electrically conductive portion of the cover at a second side of the display area that is opposite the first side of the display area.

3. The display device of claim 2, further comprising at least one common electrode in the non-display area at the second side of the display area, connecting the at least one power line to the at least one electrically conductive portion,
wherein, the at least one common electrode comprises at least one contact hole, and
wherein, the display device further comprises a conductive material electrically connecting the contact hole with the at least one electrically conductive portion of the cover.

4. The display device of claim 1, further comprising at least one pad in the non-display area at the first side of the display area, electrically coupled to the at least one source driving IC and comprising at least one area configured to receive a data signal.

5. The display device of claim 4, wherein the at least one pad is configured to receive the at least one power supply voltage from outside and the at least one source driving IC is configured to receive the at least one power supply voltage via the at least one pad; or
wherein the at least one source driving IC is configured to receive the at least one power supply voltage from outside and supply the at least one power supply voltage to the display area through the at least one pad,
wherein, the at least one pad is in contact with the at least one electrically conductive portion of the cover.

6. The display device of claim 4, further comprising a data driving unit coupled to the at least one pad and configured to provide at least one data signal to the at least one pad.

7. The display device of claim 1, further comprising at least one additional power line in the display area, coupled to the at least one source driving IC at the first side of the display area so as to receive the at least one power supply voltage directly from the at least one source driving IC without the at least one electrically conductive portion of the cover coupled in-between.

8. The display device of claim 1, wherein the at least one electrically conductive portion comprises a first portion and a second portion electrically insulated from the first portion,
wherein the at least one power line comprises a first power line coupled to the first portion and a second power line coupled to the second portion, and
wherein the first portion is configured to receive a first power supply voltage and the second portion is configured to receive a second power supply voltage that is different from the first power supply voltage.

9. The display device of claim 1, wherein the cover comprises a metal encapsulation, and the at least one electrically conductive portion comprises at least one portion of the metal encapsulation.

10. The display device of claim 9, wherein the metal encapsulation comprises a first portion and a second portion, wherein an electrically insulating region is disposed between the first portion and the second portion so as to insulate the first portion from the second portion.

11. The display device of claim 1, wherein the cover comprises an insulating layer coated with a conductive layer,
wherein, the conductive layer comprises a metal or a metal alloy, and
wherein, the conductive layer is coated with an additional insulating layer.

12. The display device of claim 11, wherein the conductive layer comprises a first portion and a second portion, wherein an electrically insulating region is disposed between the first portion and the second portion so as to insulate the first portion from the second portion.

13. The display device of claim 10, wherein the at least one power line comprises a first power line coupled to the first portion and a second power line coupled to the second portion, wherein the first portion is configured to receive a first power supply voltage and supply the first power supply voltage to the first power line, and wherein the second portion is configured to receive a second power supply voltage and supply the second power supply voltage to the second power line, wherein a first contact hole is provided to connect the first power line to the first portion, and a second contact hole is provided to connect the second power line to the second portion.

14. The display device of claim 2, further comprising:

a first conductive line in the non-display area extending from the first side of the display area to the second side of the display area; and a second conductive line in the non-display area at the second side of the display area, connected to the first conductive line, wherein the at least one electrically conductive portion of the cover is configured to receive a first power supply voltage, wherein the first conductive line is configured to receive a second power supply voltage that is different from the first power supply voltage, wherein the second conductive line is configured to supply the second power supply voltage to the display area.

15. The display device of claim 1, configured as an organic light emitting display device, wherein the at least one electrically conductive portion of the cover comprises a metal encapsulation coupled to a cathode of the display device, wherein:

the cathode is formed to extend to the metal encapsulation and is electrically connected to the metal encapsulation by means of an electrically conductive material in contact with an outer side of the cathode and the metal encapsulation, or the cathode is electrically connected to the metal encapsulation by means of an adhesive film disposed between the cathode and the metal encapsulation and having an electrically conductive material dispersed within the adhesive film.

* * * * *